US006523149B1

(12) United States Patent
Mehrotra et al.

(10) Patent No.: US 6,523,149 B1
(45) Date of Patent: Feb. 18, 2003

(54) METHOD AND SYSTEM TO IMPROVE NOISE ANALYSIS PERFORMANCE OF ELECTRICAL CIRCUITS

(75) Inventors: Sharad Mehrotra, Austin, TX (US); Mark W. Wenning, Cedar Park, TX (US); David J. Widiger, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 09/666,272

(22) Filed: Sep. 21, 2000

(51) Int. Cl.$^7$ .............................................. G06F 17/50
(52) U.S. Cl. .................... 716/4; 716/1; 716/2; 716/3
(58) Field of Search ................ 716/1, 4, 5, 6; 324/613, 614; 703/13, 14, 16

(56) References Cited

U.S. PATENT DOCUMENTS

| | | | | | |
|---|---|---|---|---|---|
| 5,555,506 A | * | 9/1996 | Petschauer et al. | ........... | 703/13 |
| 5,831,870 A | * | 11/1998 | Folta et al. | ...................... | 716/5 |
| 5,838,582 A | * | 11/1998 | Mehrotra et al. | ............... | 716/5 |
| 6,029,117 A | * | 2/2000 | Devgan | ........................ | 702/58 |
| 6,117,182 A | * | 9/2000 | Alpert et al. | .................. | 703/13 |
| 6,135,649 A | * | 10/2000 | Feldmann et al. | ............. | 703/14 |
| 6,308,304 B1 | * | 10/2001 | Devgan et al. | ................. | 716/5 |
| 6,327,542 B1 | * | 12/2001 | McBride | ...................... | 702/191 |
| 6,363,516 B1 | * | 3/2002 | Cano et al. | .................... | 716/10 |
| 6,378,109 B1 | * | 4/2002 | Young et al. | ................... | 716/2 |

* cited by examiner

Primary Examiner—Matthew Smith
Assistant Examiner—Magid Dimyan
(74) Attorney, Agent, or Firm—Duke W. Yee; Robert M. Carwell; Michael R. Nichols

(57) ABSTRACT

A method, system and apparatus is provided to perform noise analysis of electrical circuits. The method and system partitions an original multi-port circuit to a reduced circuit model having a specific layout configuration. The reduced circuit model may have a variety of configurations. Then an input signal is applied to a first port of the reduced circuit model using the specific layout configuration and an output signal is measured from a second port of the reduced circuit model. The process continues until all input ports which may contribute noise to the circuit are measured and then the results are calculated to determine the total output of simulated noise experienced by the circuit. The calculated output results of the reduced circuit model are then used to determine whether the original circuit is designed to withstand the quantity of noise experienced by the reduced circuit model.

45 Claims, 8 Drawing Sheets

METHOD AND SYSTEM TO IMPROVE NOISE ANALYSIS PERFORMANCE OF ELECTRICAL CIRCUITS

BACKGROUND OF THE INVENTION

1. Technical Field

The present invention relates to circuit design and verification of circuits. More particularly, the present invention relates to noise analysis circuit modeling. Still more particularly, the present invention relates to noise simulation modeling for electrical circuits.

2. Description of Related Art

In electrical circuits, noise is an extraneous signal that may be capacitively coupled into a digital circuit from other parts of the system. One source of noise is a signal pickup from a changing voltage on another wire, such as a nearby logic signal wire, also known as a "net", which connects two or more electronic circuit components. For example, a net may be the wiring connecting components together, such as, for example, two or more latches, but not the components themselves. Such noise may also be due to capacitive cooling or ground shift.

When the electrical circuit is a digital circuit, the circuit operates by logically combining signals with binary states, (i.e., "0" or "1"), the result which may be presented as an electrical signal to the input of a "latch" circuit device which captures the state of the input signal at a time typically defined by the changing state of a "clock" signal. These inputs must remain in the active state long enough for the "latch" circuitry to respond. The input signal to the latch may be formed by several stages of "combinational logic" circuits which in effect logically combine many logic inputs to form the single input to the latch. If any net comprising the combinational logic circuit incurs noise of sufficient amplitude and duration, it may change state (i.e. from "0" to "1" or "1" to "0"), which will be presented to the next stage of a circuit and so on until eventually a state change may take place at the input to the latch. If the latch is clocked while this erroneous state is present, the latch will sample the wrong state and the circuit will have failed by providing the wrong output.

In electrical design, such as semiconductor chip design, it is important to simulate noise which may be induced on a "victim" net of the chip by its neighboring "aggressor" nets. An aggressor net may be the wire carrying the output from a component (i.e. a latch) to another component (i.e. another latch). Therefore, during the design of such circuits, it is important to simulate such noise situations and to engineer a design for which such noise-induced failures cannot occur.

The common approach of simulating noise-induced failures is to simulate the noise due to each of the relevant aggressor nets on the circuit inputs or sinks connected to a victim net and then to sum all measured outputs to get the total noise experienced by the sink. This is commonly a costly process because a simulation circuit consisting of victim and aggressor circuits must be constructed and simulated for each aggressor net. For a digital chip design with thousands to millions of nets, it may be that all the nets contained on the digital chip are tested for noise, but such extensive testing is not needed in all cases, such as, for example, nets contained in a small region, net which are overdriven, and the like. So the challenge to a designer of digital chip circuitry is the cost versus benefit of noise testing, the costs including, for example, the time and resource expenditures associated with extensive testing.

Traditionally, attempts to reduce costs have been made by creating a "simple" circuit and employing this circuit to simulate noise for all nets without regard to the particular characteristics of each particular net. Unfortunately, this technique enhances the probability of erroneous findings. Furthermore, techniques such as using rules-of-thumb or analytical expressions have been used, but work for only simple topologies.

Thus, it would be advantageous, to have an improved method and apparatus for an operation which can simulate induced noise on an electrical circuit during the design of such a circuit.

SUMMARY OF THE INVENTION

The present invention provides a method, system and apparatus to perform noise analysis of electrical circuits. The method and system partitions an original multi-port circuit to a reduced circuit model having a specific layout configuration. The reduced circuit model may have a variety of configurations. Then an input signal is applied to a first port of the reduced circuit model using the specific layout configuration and an output signal is measured from a second port of the reduced circuit model. The process continues until all input ports which may contribute noise to the circuit are measured and then the results are calculated to determine the total simulated noise output experienced by the circuit. The calculated output results of the reduced circuit model are then used to determine whether the original circuit is designed to withstand the quantity of noise experienced by the reduced circuit model.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
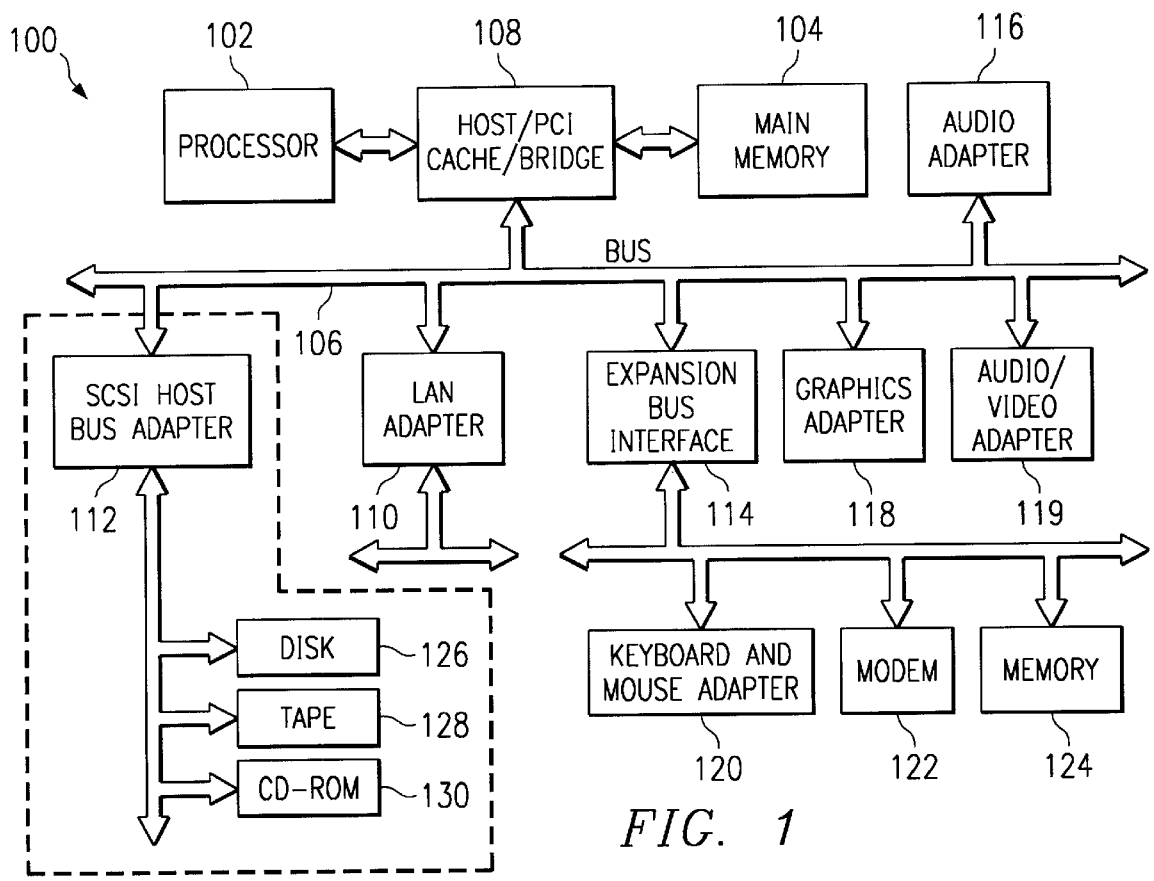
FIG. 1 is a block diagram illustrating an exemplary data processing system in which the present invention may be implemented.

With reference now to the figures, FIG. 1 is a block diagram illustrating an exemplary data processing system in which the present invention may be implemented. Data processing system 100 employs a peripheral component interconnect (PCI) local bus architecture. Although the depicted example employs a PCI bus, other bus architectures such as Micro Channel and Industry Standard Architecture (ISA) may be used. Processor 102 and main memory 104 are connected to PCI local bus 106 through PCI bridge 108. PCI bridge 108 also may include an integrated memory controller and cache memory for processor 102. Additional connections to PCI local bus 106 may be made through direct component interconnection or through add-in boards. In the depicted example, local area network (LAN) adapter 110, SCSI host bus adapter 112, and expansion bus interface 114 are connected to PCI local bus 106 by direct component connection. In contrast, audio adapter 116, graphics adapter 118, and audio/video adapter 119 are connected to PCI local bus 106 by add-in boards inserted into expansion slots. Expansion bus interface 114 provides a connection for a keyboard and mouse adapter 120, modem 122, and additional memory 124. SCSI host bus adapter 112 provides a connection for hard disk drive 126, tape drive 128, and CD-ROM drive 130. Typical PCI local bus implementations will support three or four PCI expansion slots or add-in connectors.

An operating system runs on processor 102 and is used to coordinate and provide control of various components within data processing system 100 in FIG. 1. The operating system may be a commercially available operating system such as OS/2, which is available from International Business Machines Corporation. "OS/2" is a trademark of International Business Machines Corporation. An object oriented programming system such as Java may run in conjunction with the operating system and provides calls to the operating system from Java programs or applications executing on data processing system 100. "Java" is a trademark of Sun Microsystems, Inc. Instructions for the operating system, the object-oriented operating system, and applications or programs are located on storage devices, such as hard disk drive 126, and may be loaded into main memory 104 for execution by processor 102.

Those of ordinary skill in the art will appreciate that the hardware in FIG. 1 may vary depending on the implementation. Other internal hardware or peripheral devices, such as flash ROM (or equivalent nonvolatile memory) or optical disk drives and the like, may be used in addition to or in place of the hardware depicted in FIG. 1.

Also, the processes of the present invention may be applied to a multiprocessor data processing system. For example, data processing system 100, if optionally configured as a network computer, may not include SCSI host bus adapter 112, hard disk drive 126, tape drive 128, and CD-ROM 130, as noted by dotted line 132 in FIG. 1 denoting optional inclusion. In that case, the computer, to be properly called a client computer, must include some type of network communication interface, such as LAN adapter 110, modem 122, or the like. As another example, data processing system 100 may be a stand-alone system configured to be bootable without relying on some type of network communication interface, whether or not data processing system 100 comprises some type of network communication interface. As a further example, data processing system 100 may be a Personal Digital Assistant (PDA) device which is configured with ROM and/or flash ROM in order to provide non-volatile memory for storing operating system files and/or user-generated data.

The depicted example in FIG. 1 and above-described examples are not meant to imply architectural limitations.

The present invention provides a method and apparatus to improve the performance of noise simulation in electrical circuits. Such simulation may be performed on a data processing system, such as, for example, data processing system 100 in FIG. 1. The noise simulation method of the present invention does not compromise the accuracy of detecting noise failure problems in digital chip design. The noise simulation system of the present invention utilizes successively simpler more pessimistic circuit models to simulate capacitively coupled noise that may be present on a digital chip containing thousands or millions of integrated circuits. Each circuit model consists of a configuration of resistors and capacitors which simulate the wiring nets and the effect each discrete wiring net has on other wiring nets that may also exist on the digital chip. Depending on the simulation procedure used, a voltage is applied to multiple aggressor drivers either simultaneously or individually and a resulting voltage is measured at a victim sink which simulates the noise induced upon the victim sink.

Then a determination is made as to whether or not the voltage measured at the victim sink is at an acceptable level. If the voltage measured is below a predetermined adequate level for the proper operation of the circuit, the testing for induced noise behavior characteristics for this circuit ends and thereafter other circuits may be tested in a similar manner. If it is determined that the voltage measured at the victim sink is not acceptable, successively more complex less pessimistic circuit models are be used. Subsequent to the completion of each simulation, a determination is made as to whether or not to accept the measured results or if further testing is required using successively more complex less pessimistic circuit models until eventually the full circuit model is used which has no pessimism at all.

In one embodiment, the operation of examining a net is similar for each circuit model used. Each aggressor driver connected to the model circuit is fired one at a time with all other aggressor models not firing. By "firing" it is meant that the driver output transitions from its low output state to its high output state or visa versa, commonly known as "switching". For each fired aggressor driver, a voltage is measured at a victim sink which is the simulated amount of noise that may be present and affecting the victim sink on a digital chip. This operation is repeated as many times as there are individual aggressor drivers. The total simulated noise affecting the victim sink is determined by summing the voltages measured during each individual driver firing. This measured simulated noise is then analyzed to determine whether the circuit design in question is within design guidelines or not.

Figure 2:
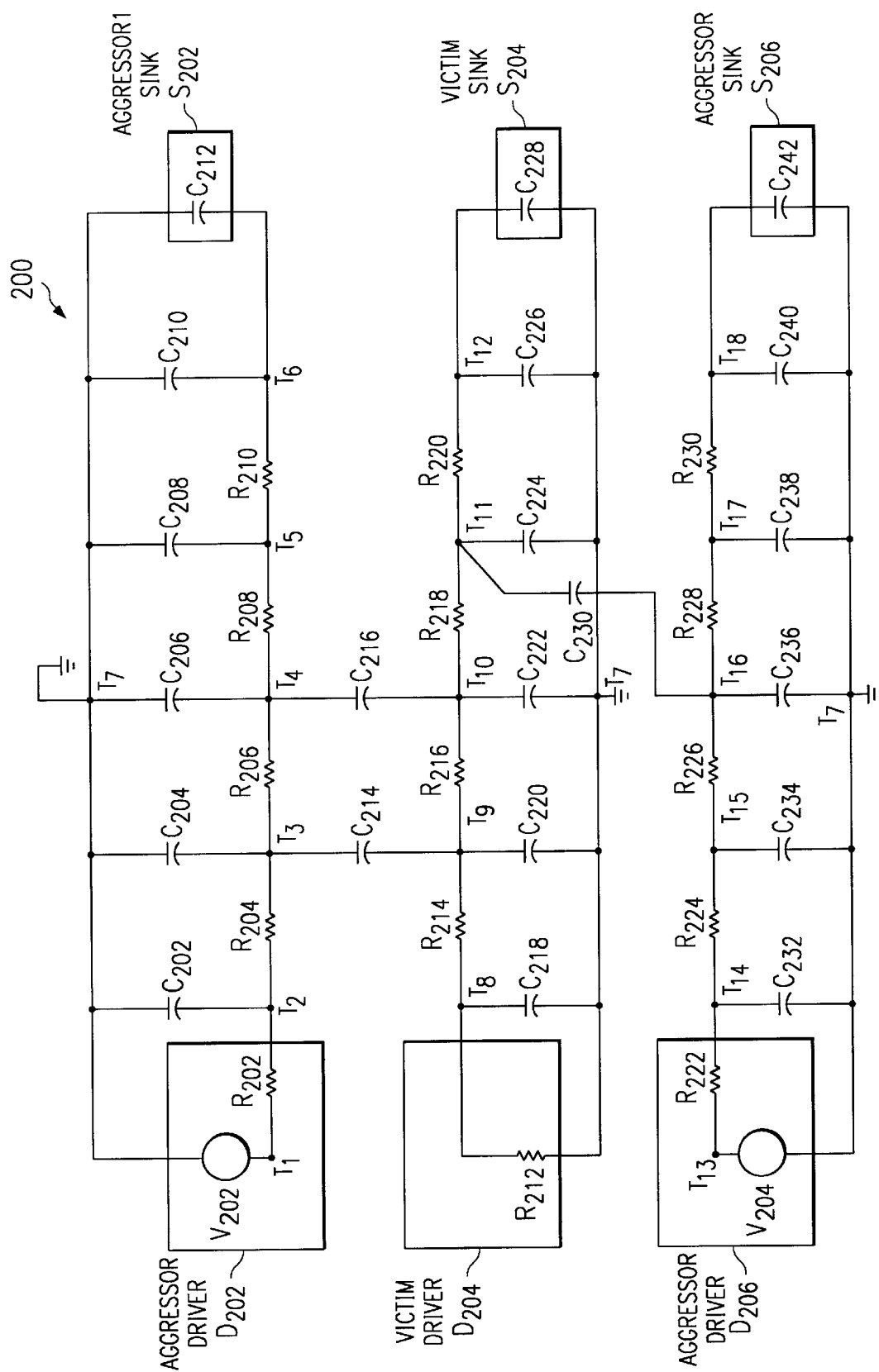
FIG. 2 is an exemplary illustration of the "all" procedure of the "full" circuit model in which the present invention may be implemented.

FIG. 2 is an exemplary illustration of the "all" procedure of the "full" circuit model in which the present invention may be implemented. The full circuit model representing the victim and aggressor nets is constructed and is employed to simulate the noise which may affect a victim sink. The "full"

circuit model may consist of a portion which represents the victim net, a portion which represents the aggressor nets, and a set of capacitors (coupling capacitors) which link the victim and aggressor nets and which may be the vehicle by which voltage simulating noise is capacitively coupled from the aggressor nets to the victim net.

A typical digital net such as the victim or aggressor net may consist of a "driver", one or more "sinks", and a wire connecting these together represented as resistors and capacitors. The driver may be a low-impedance circuit which may dominantly affect the potential on the net wire. For example, in digital chip technology, a popular technology is CMOS (Complementary Metal Oxide Semiconductor) which uses two types of transistor devices, N-fets and P-fets. A driver may be a combination of these two transistor devices which allows the driver to apply voltage to a net. The victim net may be non-switching (the victim driver is holding either a "1" potential or a "0" potential) during the noise simulation and voltage measurement at the victim sink. Any relevant net may have both drivers and sinks. A driver may control the voltage on a net and the sink may sense the voltage on the net. Aggressor sinks and victim drivers are an integral part of any design, and therefore drivers communicate with sinks. Aggressor sinks and victim drivers are included in a circuit model because their presence to some extent may affect the noise simulation of a circuit. Therefore, the victim driver may be represented simply as a resistor.

In this example, "full" circuit model 200 consists of aggressor driver $D_{202}$, victim driver $D_{204}$, and aggressor driver $D_{206}$. "Full" circuit model 200 also consists of aggressor sink $S_{202}$, victim sink $S_{204}$ and aggressor sink $S_{206}$. Aggressor driver $D_{202}$ consists of voltage source $V_{202}$ and resistor $R_{202}$ which is connected to one polarity of voltage source $V_{202}$ at terminal $T_1$ and the opposing polarity of voltage source $V_{202}$ is connected to ground at terminal $T_7$. Likewise, aggressor driver $D_{206}$ consists of voltage source $V_{204}$ and resistor $R_{222}$ which is connected to one polarity of voltage source $V_{204}$ at terminal $T_{13}$ and the opposing polarity of voltage source $V_{204}$ is connected to ground at terminal $T_7$. Victim driver $D_{204}$ consists of resistor $R_{212}$ and victim sink $S_{204}$ consists of capacitor $C_{228}$. Aggressor sinks $S_{202}$ and $S_{206}$ consist of capacitors $C_{212}$ and $C_{242}$, respectively.

Aggressor driver $D_{202}$ is connected to capacitor $C_{202}$ by way of resistor $R_{202}$ at terminal $T_2$ with the opposing end of capacitor $C_{202}$ connected to ground at terminal $T_7$. Resistor $R_{204}$ is interposed between the junction of resistor $R_{202}$ and capacitor $C_{202}$ at terminal $T_2$ and capacitors $C_{204}$ and $C_{214}$ at terminal $T_3$ with the opposing end of capacitor $C_{20}$ connected to ground at terminal $T_7$ and the opposing end of capacitor $C_{214}$ connected to terminal $T_9$. Resistor $R_{206}$ is interposed between the junction of resistor $R_{204}$ and capacitors $C_{204}$ and $C_{214}$ at terminal $T_3$ and the junction of capacitors $C_{206}$ and $C_{216}$ at terminal $T_4$ with the opposing end of capacitor $C_{206}$ connected to ground at terminal $T_7$ and the opposing end of capacitor $C_{216}$ connected to terminal $T_{10}$. Resistor $R_{208}$ is interposed between the junction of resistor $R_{206}$ and capacitors $C_{206}$ and $C_{216}$ at terminal $T_4$ and capacitor $C_{208}$ at terminal $T_5$ with the opposing end of capacitor $C_{208}$ connected to ground at terminal $T_7$. Resistor $R_{210}$ is interposed between the junction of resistor $R_{208}$ and capacitor $C_{208}$ at terminal $T_5$ and capacitor $C_{210}$ and capacitor $C_{212}$ within aggressor sink $S_{202}$ at terminal $T_6$ with the opposing end of capacitors $C_{210}$ and $C_{212}$ connected to ground at terminal $T_7$.

Victim driver $D_{204}$ which contains resistor $R_{212}$ is connected to capacitor $C_{218}$ by way of resistor $R_{212}$ at terminal $T_8$ with the opposing ends of resistor $R_{212}$ and capacitor $C_{218}$ connected to ground at terminal $T_7$. Resistor $R_{214}$ is interposed between the junction of resistor $R_{212}$ and capacitor $C_{218}$ at terminal $T_8$ and the junction of capacitors $C_{220}$ and $C_{214}$ at terminal $T_9$ with the opposing end of capacitor $C_{220}$ connected to ground at terminal $T_7$. Resistor $R_{216}$ is interposed between the junction of capacitors $C_{214}$ and $C_{220}$ at terminal $T_9$ and capacitors $C_{216}$ and $C_{222}$ at terminal $T_{10}$ with the opposing end of capacitor $C_{222}$ connected to ground at terminal $T_7$. Resistor $R_{218}$ is interposed between the junction of capacitors $C_{216}$ and $C_{222}$ at terminal $T_{10}$ and capacitors $C_{224}$ and $C_{230}$ at terminal $T_{11}$ with the opposing end of capacitor $C_{224}$ connected to ground at terminal $T_7$ and the opposing end of capacitor $C_{230}$ connected to terminal $T_{16}$. Resistor $R_{220}$ is interposed between the junction of resistor $R_{218}$ and capacitors $C_{224}$ and $C_{230}$ at terminal $T_{11}$ and capacitor $C_{226}$ and capacitor $C_{228}$ within victim sink $S_{204}$ at terminal $T_{12}$ with the opposing end of capacitors $C_{226}$ and $C_{228}$ connected to ground at terminal $T_7$.

Aggressor driver $D_{206}$ is connected to capacitor $C_{232}$ by way of resistor $R_{222}$ at terminal $T_{14}$ with the opposing end of capacitor $C_{232}$ connected to ground at terminal $T_7$. Resistor $R_{224}$ is interposed between the junction of resistor $R_{222}$ and capacitor $C_{232}$ at terminal $T_{14}$ and capacitor $C_{234}$ at terminal $T_{15}$ with the opposing end of capacitor $C_{234}$ connected to ground at terminal $T_7$. Resistor $R_{226}$ is interposed between the junction of resistor $R_{226}$ and capacitor $C_{234}$ terminal $T_{15}$ and the junction of capacitors $C_{236}$ and $C_{230}$ at terminal $T_{16}$ with the opposing end of capacitor $C_{236}$ connected to ground at terminal $T_7$ and the opposing end of capacitor $C_{230}$ connected to terminal $T_{11}$. Resistor $R_{228}$ is interposed between the junction of resistor $R_{226}$ and capacitors $C_{230}$ and $C_{236}$ at terminal $T_{16}$ and capacitor $C_{238}$ at terminal $T_{17}$ with the opposing end of capacitor $C_{238}$ connected to ground at terminal $T_7$. Resistor $R_{230}$ is interposed between the junction of resistor $R_{228}$ and capacitor $C_{238}$ at terminal $T_{17}$ and capacitors $C_{240}$ and capacitor $C_{242}$ within aggressor sink $S_{206}$ at terminal $T_{18}$ with the opposing end of capacitors $C_{240}$ and $C_{242}$ connected to ground at terminal $T_7$.

In the "full" circuit model of FIG. 2, two aggressor nets are shown. For the "full" circuit model, all the aggressor nets present and described above in FIG. 2 may be used for simulation utilizing the "all" simulation method. Using this simulation, aggressor driver $D_{202}$ and aggressor driver $D_{206}$ are fired individually, the voltage measured at victim sink $S_{204}$ which represents the noise being received by victim sink $S_{204}$ for each aggressor driver that is fired. Alternatively, the "pairwise" simulation method may be employed. This simulation method requires the net elements belonging to aggressor driver $D_{206}$ to be disconnected and the end of capacitor $C_{230}$, originally connected to the elements belonging to aggressor driver $D_{206}$ at terminal $T_{16}$ in the "full" circuit model, to be grounded. Then aggressor driver $D_{202}$ is fired and the voltage measured at victim sink $S_{204}$ which represents the noise being received by victim sink $S_{204}$.

Then the network elements for aggressor driver $D_{206}$ are reconnected, the elements corresponding to aggressor driver $D_{202}$ are disconnected and the end of capacitors $C_{214}$ and $C_{216}$ originally connected to the elements connected to aggressor driver $D_{202}$ at terminal $T_3$ and $T_4$, respectively, in the "full" circuit model, are grounded. Aggressor driver $D_{206}$ is then fired and the voltage measured at victim sink $S_{204}$ which represents the noise being received by victim sink $S_{204}$. The sum of these two voltage measurements, using either the "all" or "pairwise" simulation method, represents the total noise on victim net $S_{204}$ from aggressor nets $D_{202}$ and $D_{206}$. For circuits with multiple victim sinks, this process may be repeated for each such sink. It should be noted that the circuits depicted in FIG. 2 are examples of aggressor and victim circuits and that the processes of the present invention may be applied to other types of aggressor and victim circuits as well.

Figure 3:
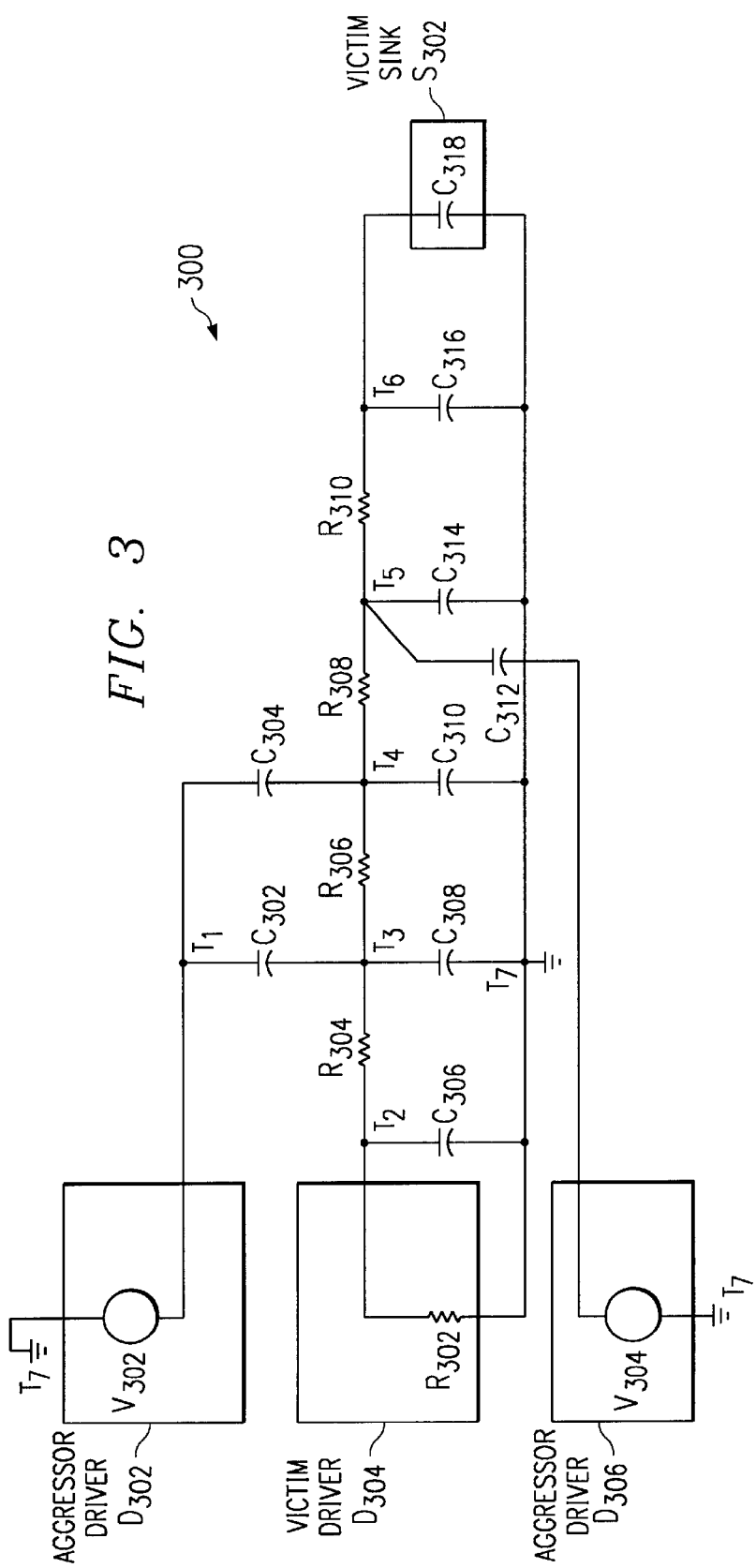
FIG. 3 is an exemplary illustration of a "fast" circuit model in which the present invention may be implemented.

FIG. 3 is an exemplary illustration of a "fast" circuit model in which the present invention may be implemented. In this example, the "fast" circuit model consists of aggressor driver $D_{302}$ which consists of voltage source $V_{302}$, victim driver $D_{304}$ which consists of resistor $R_{302}$, aggressor driver $D_{306}$ which consists of voltage source $V_{304}$ and victim sink $S_{302}$ which consists of capacitor $C_{318}$. Voltage source $V_{302}$ is connected to the junction of capacitors $C_{302}$ and $C_{304}$ at one polarity at terminal $T_1$ and the opposing polarity is connected to ground at terminal $T_7$. The opposing end of capacitor $C_{302}$ is connected to terminal $T_3$ and the opposing end of capacitor $C_{304}$ is connected to terminal $T_4$.

Victim driver $D_{304}$, which consists of resistor $R_{302}$, is connected by way of resistor $R_{302}$ to capacitor $C_{306}$ at terminal $T_2$ and the opposing end of resistor $R_{302}$ and capacitor $C_{306}$ is connected to ground at terminal $T_7$. Resistor $R_{304}$ is interposed between the junction of resistor $R_{302}$ and capacitor $C_{306}$ at terminal $T_2$ and the junction of capacitors $C_{302}$ and $C_{308}$ at terminal $T_3$. The opposing end of capacitor $C_{308}$ is connected to ground at terminal $T_7$. Resistor $R_{306}$ is interposed between the junction of resistor $R_{304}$ and capacitors $C_{302}$ and $C_{308}$ at terminal $T_3$ and the junction of capacitors $C_{304}$ and $C_{310}$ at terminal $T_4$. The opposing end of capacitor $C_{310}$ is connected to ground at terminal $T_7$. Resistor $R_{308}$ is interposed between the junction of resistor $R_{306}$ and capacitors $C_{304}$ and $C_{310}$ at terminal $T_4$ and the junction of capacitors $C_{312}$ and $C_{314}$ at terminal $T_5$ with the opposing end of capacitor $C_{314}$ connected to ground at terminal $T_7$ and the opposing end of capacitor $C_{312}$ connected to a polarity of voltage source $V_{304}$ within aggressor driver $D_{306}$. Resistor $R_{310}$ is interposed between the junction of resistor $R_{309}$ and capacitors $C_{312}$ and $C_{314}$ at terminal $T_5$ and capacitor $C_{316}$ and capacitor $C_{318}$ within victim sink $S_{302}$ at terminal $T_6$ with the opposing end of capacitors $C_{316}$ and $C_{318}$ connected to ground at terminal $T_7$.

Aggressor driver $D_{306}$ which contains voltage source $V_{304}$ is connected at one polarity to the junction of resistors $R_{308}$ and $R_{310}$ and capacitors $C_{312}$ and $C_{314}$ at terminal $T_5$ and the opposing polarity of voltage source $V_{304}$ is connected to ground at terminal $T_7$.

In this example, the "fast" circuit model consists of the "full" circuit model with the aggressor net components removed and the aggressor ends of all coupling capacitors tied to a common node. A voltage source is also tied to this common node and represents the driver of the aggressor net. This will result in greater coupled noise as opposed to the "full" circuit model since the driver of the aggressor net in the "fast" circuit model is connected more closely to the victim net for all coupling capacitors, and thus, the "fast" circuit model is more pessimistic. The simulation performance using the "fast" circuit model is improved considerably over that of the "full" circuit model since there are no aggressor circuit elements to be concerned with in the "fast" circuit model. The "fast" circuit model, previously shown to be faster and more pessimistic than the "all" version of the "full" circuit model, is also faster and more pessimistic than the "pairwise" version of the "full" circuit model. The pessimism is because the aggressor drivers are physically closer to the victim net in the "fast" model.

Figure 4:
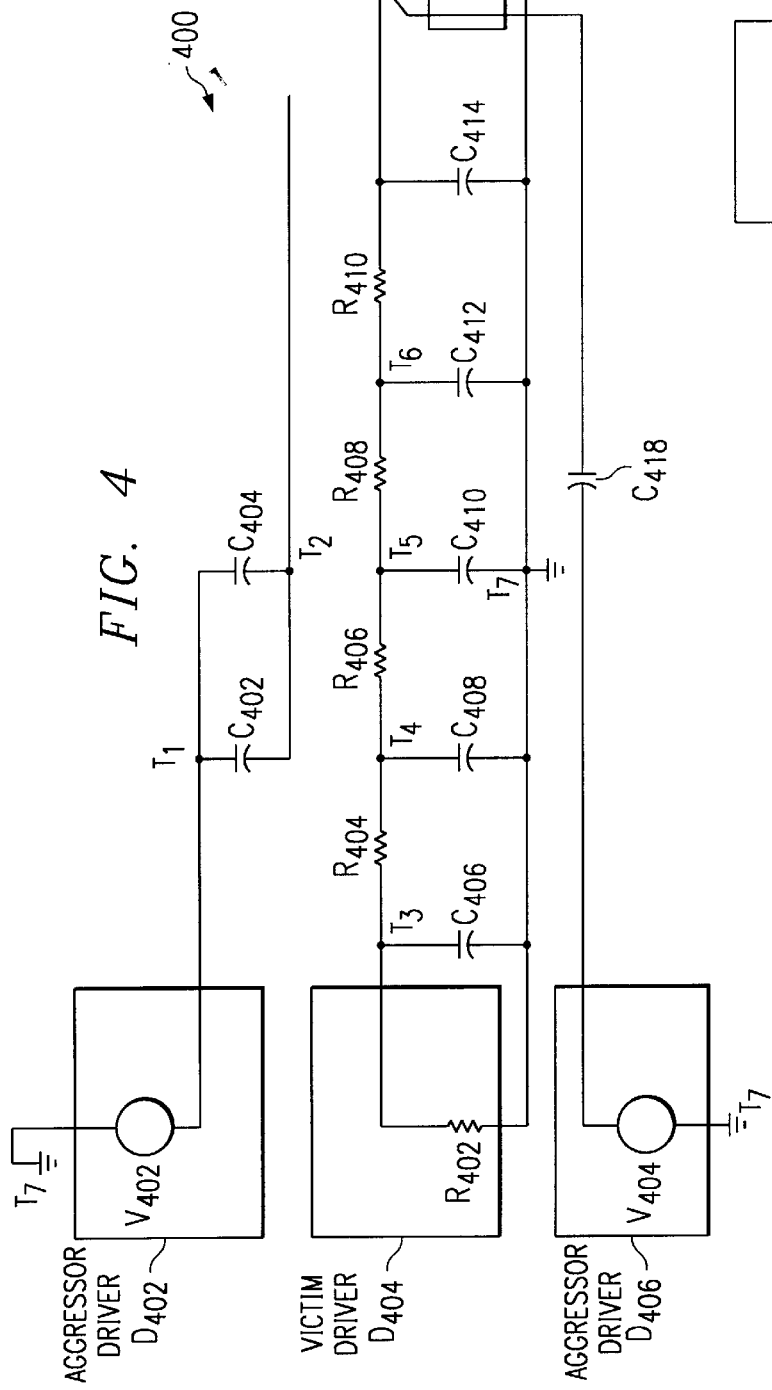
FIG. 4 is an exemplary illustration of a "faster" circuit model in which the present invention may be implemented.

FIG. 4 is an exemplary illustration of a "faster" circuit model in which the present invention may be implemented.

In this example, the "faster" circuit model consists of aggressor driver $D_{402}$ which consists of voltage source $V_{402}$, victim driver $D_{404}$ which consists of resistor $R_{402}$, aggressor driver $D_{406}$ which consists of voltage source $V_{404}$ and victim sink $S_{402}$ which consists of capacitor $C_{416}$. Voltage source $V_{402}$ is connected at one polarity to the junction of capacitors $C_{402}$ and $C_{404}$ at terminal $T_1$ with the opposite polarity of $V_{402}$ connected to ground at terminal $T_7$. The opposing ends of capacitors $C_{402}$ and $C_{404}$ are connected to the junction of capacitors $C_{414}$ and $C_{418}$ and capacitor $C_{416}$ which is a part of victim sink $S_{402}$ at terminal $T_2$ while the opposing end of capacitors $C_{414}$ and $C_{416}$ are connected to ground at terminal $T_7$ and the opposing end of capacitor $C_{411}$ is connected to one polarity of voltage source $V_{404}$ within aggressor driver $D_{406}$.

Victim driver $D_{404}$ which consists of resistor $R_{402}$ is connected to capacitor $C_{406}$ at terminal $T_3$ while the opposing end of resistor $R_{402}$ and capacitor $C_{406}$ is connected to ground at terminal $T_7$. Resistor $R_{404}$ is interposed between the junction of resistor $R_{402}$ and capacitor $C_{406}$ at terminal $T_3$ and capacitor $C_{408}$ at terminal $T_4$ while the opposing end of capacitor $C_{406}$ is connected to ground at terminal $T_7$. Resistor $R_{406}$ is interposed between the junction of resistor $R_{404}$, and capacitor $C_{408}$ at terminal $T_4$ and capacitor $C_{410}$ at terminal $T_5$ while the opposing end of capacitor $C_{410}$ is connected to ground at terminal $T_7$. Resistor $R_{408}$ is interposed between the junction of resistor $R_{406}$ and capacitor $C_{410}$ at terminal $T_5$ and capacitor $C_{412}$ at terminal $T_6$ while the opposing end of capacitor $C_{412}$ is connected to ground at terminal $T_7$. Resistor $R_{410}$ is interposed between the junction of resistor $R_{408}$ and capacitor $C_{412}$ at terminal $T_6$ and the junction of capacitors $C_{414}$, $C_{418}$, $C_{402}$, $C_{404}$ and capacitor $C_{416}$ which is a part of victim sink $S_{402}$ at terminal $T_2$ while the opposing ends of capacitors $C_{414}$ and $C_{416}$ are connected to ground at terminal $T_7$ and the opposing end of capacitor $C_{418}$ is connected to one polarity of voltage source $V_{404}$ within aggressor driver $D_{406}$.

Aggressor driver $D_{406}$ containing voltage source $V_{404}$ is connected with one polarity to capacitor $C_{418}$ while the opposing polarity is connected to ground at terminal $T_7$.

The "faster" circuit model consists of the "fast" circuit model, such as the "fast" circuit model of FIG. 3, with the victim net's end of all coupling capacitors of all aggressor drivers connected directly to the victim sink rather than to points internal to the circuit representing the wiring of the victim net. The aggressor ends of the coupling capacitors are connected to voltage sources representing the aggressor nets' drivers similar to the "fast" circuit model. The process of deriving the results of each aggressor driver firing from a single simulation must be repeated for each sink of the victim net. This "faster" circuit model is more pessimistic than the "fast" model represented in FIG. 3 since the coupling capacitance from the aggressor driver is connected closer to the sink than is the case for the "fast" circuit model.

The simulation performance is improved considerably over the "fast" circuit model in FIG. 3 since only one simulation of the circuit is necessary, the voltage representing noise from each aggressor being measured as a convolution of the single simulation result. This is apparent by considering that each aggressor driver's interaction may be modeled as a single voltage source connecting to the victim sink through a single capacitor which is the sum of all the coupling capacitance between the aggressor and the victim net. The coupling to the other (non-firing) aggressors may be represented as a capacitor from the victim sink to ground which is the sum of all these other aggressor coupling capacitances induced upon the victim net, and thereby the grounding of the capacitor being equivalent to these other aggressor voltages sources being zero. Thus, the sum of the coupling and ground capacitance is the same for each aggressor driver and, using electrical circuit theory, these two capacitors and the voltage source may be reduced down to an equivalent single capacitor in series with a scaled voltage source, where the capacitor value is constant for all aggressor drivers. The only quantity which changes from aggressor driver to aggressor driver is the value of the voltage source. The validity of this transformation is explained later.

Thus, the circuit may be simulated using an impulse signal as the voltage source and the resulting impulse response, measured at the sink, time-domain convoluted (if the impulse response is time-domain) with the appropriately-scaled aggressor driver input to get an actual voltage from that aggressor simulating the noise received by the victim driver. The process of time-domain convolution may be written as follows:

$$y(t) = \int_0^\infty h(\tau)x(t-\tau)d\tau$$

where $h(\tau)$ is the impulse response, $x(t)$ is the applied input, and $y(t)$ is the resulting output.

Furthermore, if the circuit simulator produces an impulse response which was represented in the frequency-domain, generally known to be the Laplace transform of the equivalent time-domain impulse response, then rather than using convolution, the frequency-domain form of the scaled aggressor input is simply multiplied by the frequency-domain response to get the result also in the frequency-domain. Generally known procedures may then be used to convert this result to its time-domain form. For example, AWE (Asymptotic Waveform Evaluation) simulators are generally known and understood to return results in the frequency-domain form. If such simulators are used, the time-domain convolution may be avoided in lieu of the simpler multiplication to improve the speed of analysis.

The simulation process must be repeated for each sink of the victim net. Thus, the "faster" analysis may not be faster than the "fast" analysis if the number of victim sinks is on the order of the number of aggressor nets. Such a situation is rare, though, and the process described in this invention is to recognize such a situation and forego the "faster" analysis if such is the case.

Figure 5:
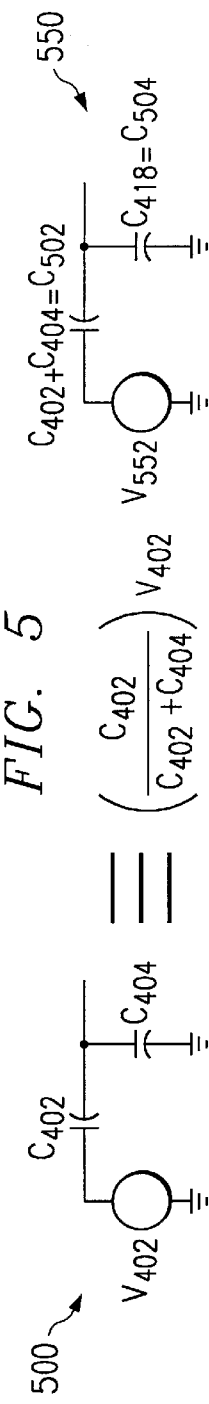
FIG. 5 is an exemplary illustration of a circuit transformation which may aid in analyzing the "faster" circuit model shown in FIG. 4 in which the present invention may be implemented.

FIG. 5 is an exemplary illustration of a circuit transformation which may aid in analyzing the "faster" circuit model shown in FIG. 4 in which the present invention may be implemented. The two circuits depicted by FIG. 5 are equivalent, generally known as a Thevenin equivalence. In this equivalence depiction, circuit 500 contains voltage source $V_{402}$ and capacitors $C_{402}$ and $C_{404}$ in parallel with each other as shown in FIG. 4. Using circuit theory, circuit 550 is equivalent to circuit 500 in which capacitors $C_{402}$ and $C_{404}$ may be combined into equivalent circuit capacitance $C_{552}$ and voltage source $V_{552}$ is a function of the value of capacitors $C_{402}$ and $C_{404}$ and voltage source $V_{402}$ and may be written as:

$$V_{552} = \left\{\frac{C_{402}}{C_{402}+C_{404}}\right\}^{V_{402}}$$

The value of voltage source $V_{552}$ in circuit 550, when simulating voltage source $V_{402}$ within aggressor driver $D_{402}$ in FIG. 4 may be written as:

$$V = \left\{\frac{C_{402}+C_{404}}{C_{402}+C_{404}+C_{418}}\right\}^{V_{402}}$$

and the value of voltage source $V_{552}$ when simulating voltage source $V_{404}$ within aggressor driver $D_{406}$ in FIG. 4 may be written as:

$$V = \left\{\frac{C_{418}}{C_{402}+C_{404}+C_{418}}\right\}^{V_{404}}$$

Using the equivalence depicted in FIG. 5, if aggressor driver $D_{402}$ ($V_{402}$) of FIG. 4 is firing and aggressor driver $D_{406}$ ($V_{404}$) is quiet, then aggressor driver $D_{406}$ looks like a short circuit to ground, and if such is the case, capacitors $C_{402}$ and $C_{404}$ may be combined into capacitor $C_{502}$ and capacitor $C_{418}$ may be represented by capacitor $C_{504}$. Therefore, the value of aggressor driver $V_{502}$ would be a fraction of aggressor driver $D_{402}$ ($V_{402}$) represented by the value of capacitor $C_{402}$ divided by the sum of capacitors $C_{402}$ and $C_{404}$. Capacitor $C_{502}$ would have the value of the sum of capacitors $C_{402}$ and $C_{404}$ and capacitor $C_{504}$ would have the same value as $C_{418}$, which in this example would be zero since aggressor driver $D_{406}$ ($V_{404}$) is zero and $C_{418}$ is connected to ground. The resulting equivalent circuit may be as shown by circuit 550.

Once these equivalencies are determined, the circuit in FIG. 4 may be represented to look like an equivalent which will be described in detail later. The same type of equivalency may be determined if aggressor driver $D_{406}$ ($V_{404}$) is fired and aggressor driver $D_{402}$ ($V_{402}$) is quiet.

Figure 6:
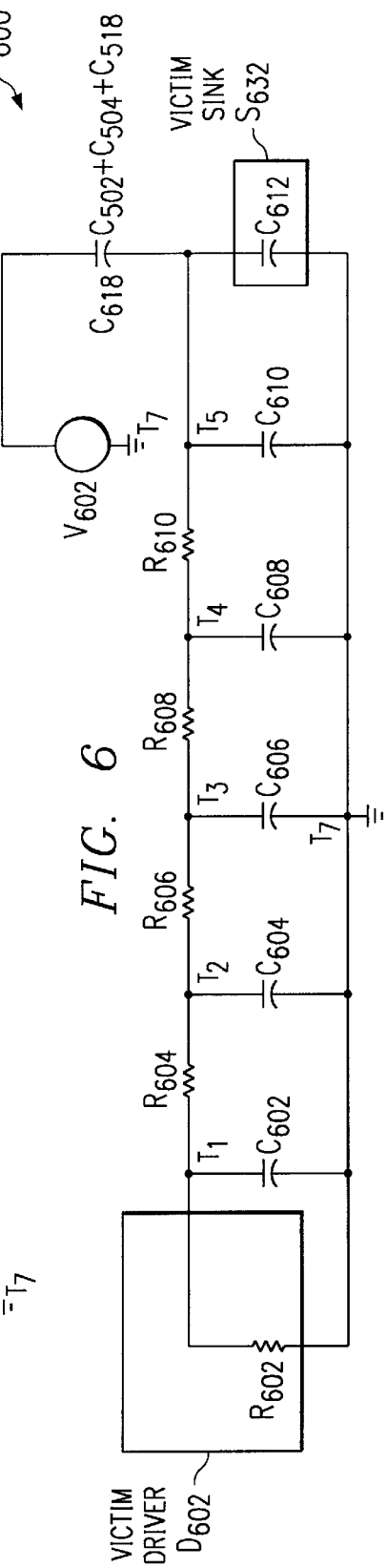
FIG. 6 is an exemplary illustration of a "faster" circuit model equivalent to the "faster" circuit model in FIG. 4 facilitated by the equivalent circuit model in FIG. 5 in which the present invention may be implemented.

FIG. 6 is an exemplary illustration of a "faster" circuit model equivalent to the "faster" circuit model in FIG. 4 facilitated by the equivalent circuit model in FIG. 5 in which the present invention may be implemented. This example, is similar to the "faster" circuit model of FIG. 4, except in FIG. 6, aggressor driver $V_{404}$ and aggressor driver $V_{406}$ have been consolidated into a single voltage source $V_{602}$ which now has the value as expressed in FIG. 5 as the sum of $V_{402}$ and $V_{404}$ in FIG. 4 and may be written as:

$$V_{602} = \left\{\frac{C_{402}+C_{404}}{C_{402}+C_{404}+C_{418}}\right\}^{V_{402}} + \left\{\frac{C_{418}}{C_{402}+C_{404}+C_{418}}\right\}^{V_{404}}$$

It is important to note that capacitor $C_{618}$ is the same value whether aggressor driver $D_{402}$ in FIG. 4 is fired and aggressor driver $D_{406}$ is quiet or if aggressor driver $D_{406}$ is fired and aggressor driver $D_{402}$ is quiet. The only difference shown in FIG. 6 is the nature of the voltage source $V_{602}$ which is based upon whether aggressor driver $D_{402}$ or aggressor driver $D_{406}$ is being fired with the other aggressor driver held quiet. The respective value of $V_{602}$ may be determined, depending on which aggressor driver $D_{402}$ or $D_{406}$ is fired, by the following equations:

$$V_{602} = \left\{\frac{C_{402}+C_{404}}{C_{402}+C_{404}+C_{418}}\right\}^{V_{402}}$$

$$V_{602} = \left\{\frac{C_{418}}{C_{402}+C_{404}+C_{418}}\right\}^{V_{404}}$$

Again, it is important to note that capacitor $C_{618}$ be independent of which aggressor driver, $D_{402}$ or $D_{406}$ in FIG. 4, is fired, while it is not as important that voltage source $V_{602}$ be independent. This is because as long as capacitor $C_{618}$ is independent of the aggressor driver being fired, only one simulation of the circuit is necessary. The solution for each firing driver may be derived from this single simulation result through time-domain convolution or frequency-domain multiplication as explained earlier.

Figure 7:
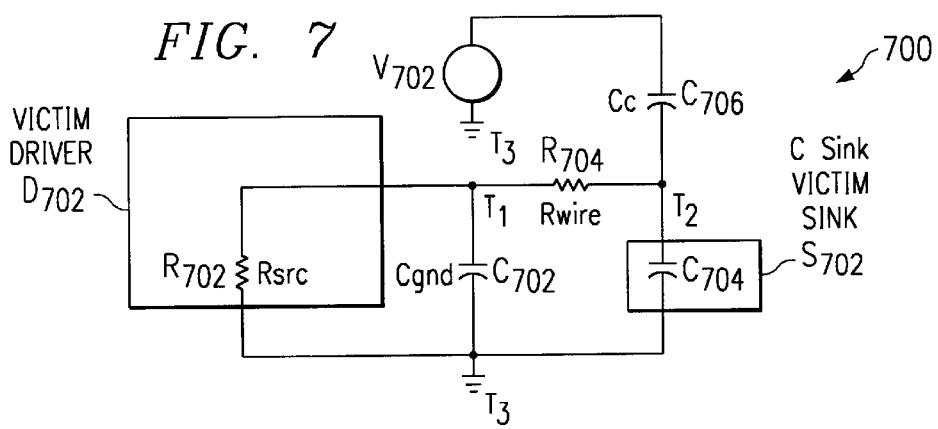
FIG. 7 is an exemplary illustration of a "fastest" circuit model in which the present invention may be implemented.

FIG. 7 is an exemplary illustration of a "fastest" circuit model in which the present invention may be implemented.

In this example, victim driver $D_{702}$ contains resistor "Rrsc" $R_{702}$ which is connected to capacitor "Cgnd" $C_{702}$ on one end at terminal $T_1$ and on the opposing end, resistor "Rsrc" $R_{702}$ and capacitor "Cgnd" $C_{702}$ is connected to ground at terminal $T_3$. Interposed between the junction of resistor "Rrsc" $R_{702}$ and capacitor "Cgnd" $C_{702}$ at terminal $T_1$ and the junction of capacitors "Csink" $C_{704}$ within victim sink $S_{704}$ and "Cc" $C_{706}$ at terminal $T_2$ is resistor "Rwire" $R_{704}$ with the opposing end of capacitors "Cgnd" $C_{702}$ and "Csink" $C_{704}$ connected to ground at terminal $T_3$ and the opposing end of capacitor "Cc" $C_{706}$ connected to one polarity of voltage source $V_{702}$. The opposing end of voltage source $V_{702}$ is connected to ground at terminal $T_3$.

In this example, capacitor "Cgnd" $C_{702}$ is the sum of the capacitors $C_{406}$, $C_{408}$, $C_{410}$, $C_{412}$, and $C_{414}$ to ground on the victim net in FIG. 4 and capacitor "Cc" $C_{706}$ is the sum of capacitors $C_{402}$, $C_{404}$, and $C_{418}$ in FIG. 4. Resistor "Rwire" $R_{704}$ is the sum of the resistors $R_{404}$, $R_{406}$, $R_{408}$, and $R_{410}$ of the victim net in FIG. 4, and resistor "Rsrc" $R_{702}$ and "Csink" $C_{704}$ are the same values as the corresponding elements resistor $R_{402}$ and capacitor $C_{416}$ in victim driver $D_{404}$ and victim sink $S_{402}$, respectively, in FIG. 4. Here, voltage source $V_{702}$ is taken as a fraction of $V_{402}$ or $V_{404}$ as was done with the "faster" model.

In this example, resistor "Rsrc" $R_{702}$ is the "quiet" resistance of the driver of the victim net. The "quiet" resistance is the resistance of a driver on the victim net which, for purposes of the noise simulation analysis, is not switching, such as, for example resistor $R_{212}$ in FIG. 2. Capacitor "Cgnd" $C_{702}$ is the sum of all capacitors to ground and of any sink capacitors other than the sink at which the noise is being simulated. Resistor "Rwire" $R_{704}$ is the sum of all resistors representing the wiring resistance of the victim net. Capacitor "Cc" $C_{701}$ is the sum of all capacitors between the victim net and the aggressor being considered. Capacitor "Csink" $C_{704}$ is the capacitance associated with the sink at which the noise is being simulated plus the sum of the coupling capacitors of all aggressors not being considered. $V_{702}$ represents the waveform at the driver of the aggressor net.

This circuit may be constructed from the "faster" circuit by moving any non-coupling capacitor to the victim driver and by moving any resistance not in the path from the quiet driver to the quiet sink into that path, again processes that can only increase noise. Thus, the circuit is more pessimistic than the faster circuit. The simulation performance is clearly faster than either the "fast" or "faster" circuit models since there is a closed-form impulse response for this circuit which may, as in the case of the "faster" circuit, be transformed for each aggressor through a convolution process. Closed-form is meant that the impulse response may be expressed as an equation in terms of time, t, and the values of the circuit capacitor and resistor elements shown in FIG. 7. This is in contrast to the "full", "fast", and "faster" models which would require a circuit simulation to determine the impulse response.

This circuit may not require complete details of the victim net's circuit, only certain general qualities being required, which may be predetermined and kept in a database for fast retrieval. The reason complete details of the "fastest" circuit are not required is that any component in the "fastest" circuit represents a general component of the circuit, such as, for example resistor $R_{704}$ which represents the total wiring resistance of the net, capacitor $C_{706}$ which represents the total capacitive coupling between the victim and the particular aggressor driver being considered, and capacitor $C_{702}$ which represents the sum of the total grounded capacitance and the total capacitive coupling between the victim net and the aggressor nets not being considered. The values of these components may be determined from the detailed circuit, such as, for example circuit 200 in FIG. 2.

It may also be possible to perform the noise simulation operation of the present invention without the details of the "fastest" model by saving the details of the "fastest" model and by having these quantities precomputed for the values needed for the "fastest" circuit model. By this method, this may speed up the operation by deferring the reading or possibly even the extraction of the circuit details by simply obtaining the general component values initially, testing for noise characteristics using the "fastest" model, and if the test fails, reading or extracting the more detailed circuit model required for the "faster", "fast", and "full" circuit models.

Figure 8:
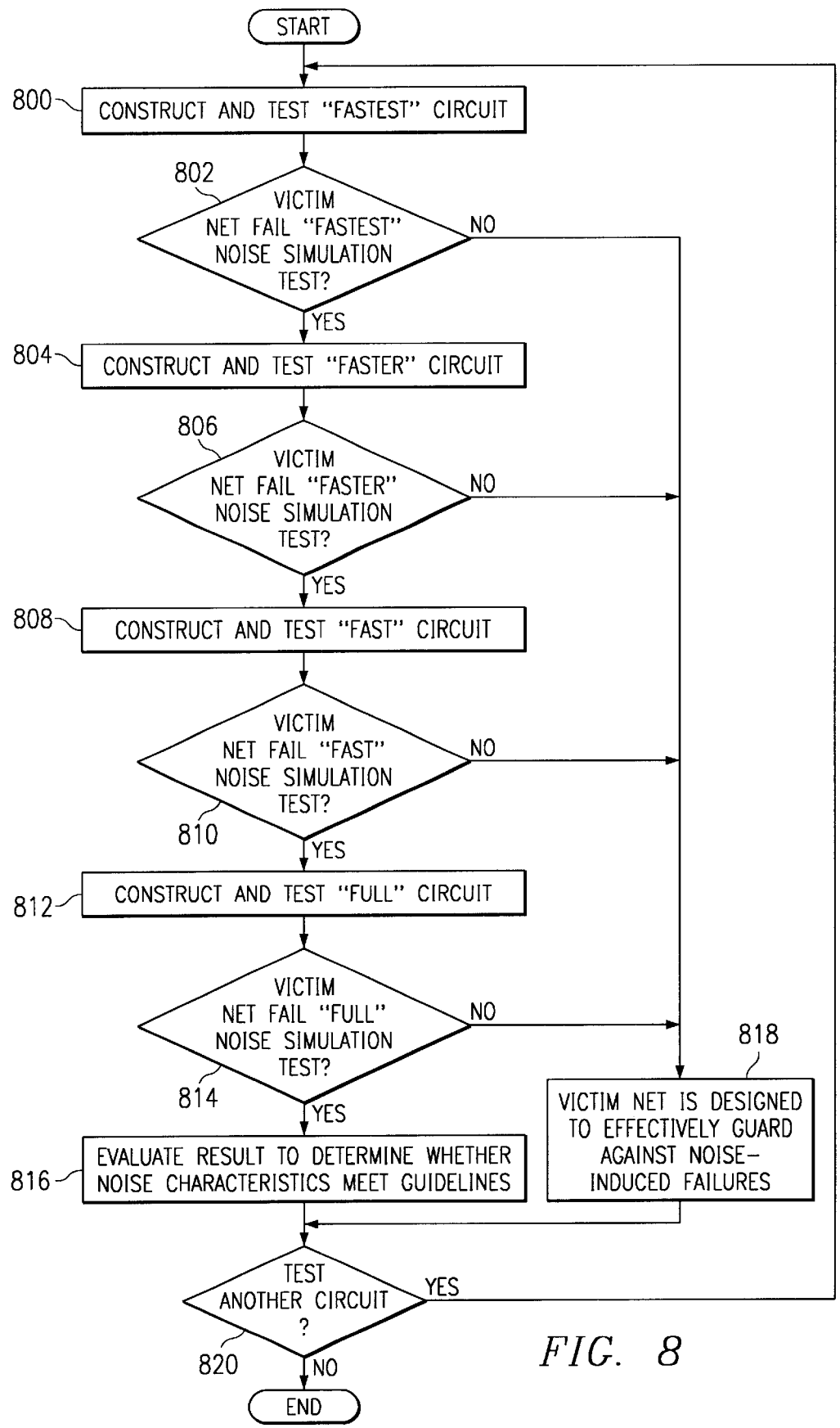
FIG. 8 is a flowchart illustrating a noise simulation technique using equivalent circuit models in accordance with a preferred embodiment of the present invention.

FIG. 8 is a flowchart illustrating a noise simulation technique using equivalent circuit models in accordance with a preferred embodiment of the present invention. In this example, the operation begins with the "fastest" circuit model being constructed and tested to determine the noise behavior characteristics of the victim net (step 800). Then a determination is made as to whether or not the victim net has failed the noise simulation test (step 802). If the victim net has not failed the "fastest" circuit noise simulation test (step 802:NO), then the victim net is effectively guarded against noise-induced failures (step 818). If the victim net fails the "fastest" circuit noise simulation test (step 802:YES), then the "faster" circuit model is constructed and tested to determine the noise behavior characteristics of the victim net (step 804). Then a determination is made as to whether or not the victim net has failed the "faster" circuit noise simulation test (step 806). If the victim net has not failed the "faster" model noise simulation test (step 806:NO), then the victim net is effectively guarded against noise induced failures (step 818). If the victim net fails the "faster" circuit noise simulation test (step 806:YES), then the "fast" circuit model is constructed and tested to determine the noise behavior characteristics of the victim net (step 808).

Then a determination is made as to whether or not the victim net has failed the "fast" circuit noise simulation test (step 810). If the victim net has not failed the "fast" circuit noise simulation test (step 810:NO), then the victim net is effectively guarded against noise induced failures (step 818). If the victim net has failed the "fast" circuit noise simulation test (step 810:YES), then the "full" circuit model is constructed and tested to determine the noise behavior characteristics of the victim net (step 812). Then a determination is made as to whether or not the victim net has failed the "full" circuit noise simulation test (step 814). If the victim net has not failed the "full" circuit noise simulation test (step 814:NO), then the victim net is effectively guarded against noise induced failures (step 818). If the victim net fails the "full" circuit noise simulation test (step 814:YES), the results of this simulation are evaluated to determine if the circuit design meets guidelines for shielding against noise induced failures (step 816). Then a determination is made as to whether or not another circuit is to be tested using the procedures of the present invention (step 820). If it is determined that another circuit is to be tested for noise behavior (step 820:YES), the operation returns to step 800 for the construction and testing using the "fastest" circuit simulation model. Otherwise, if there are no other circuits to be tested (step 820:NO), the operation terminates.

Figure 9:
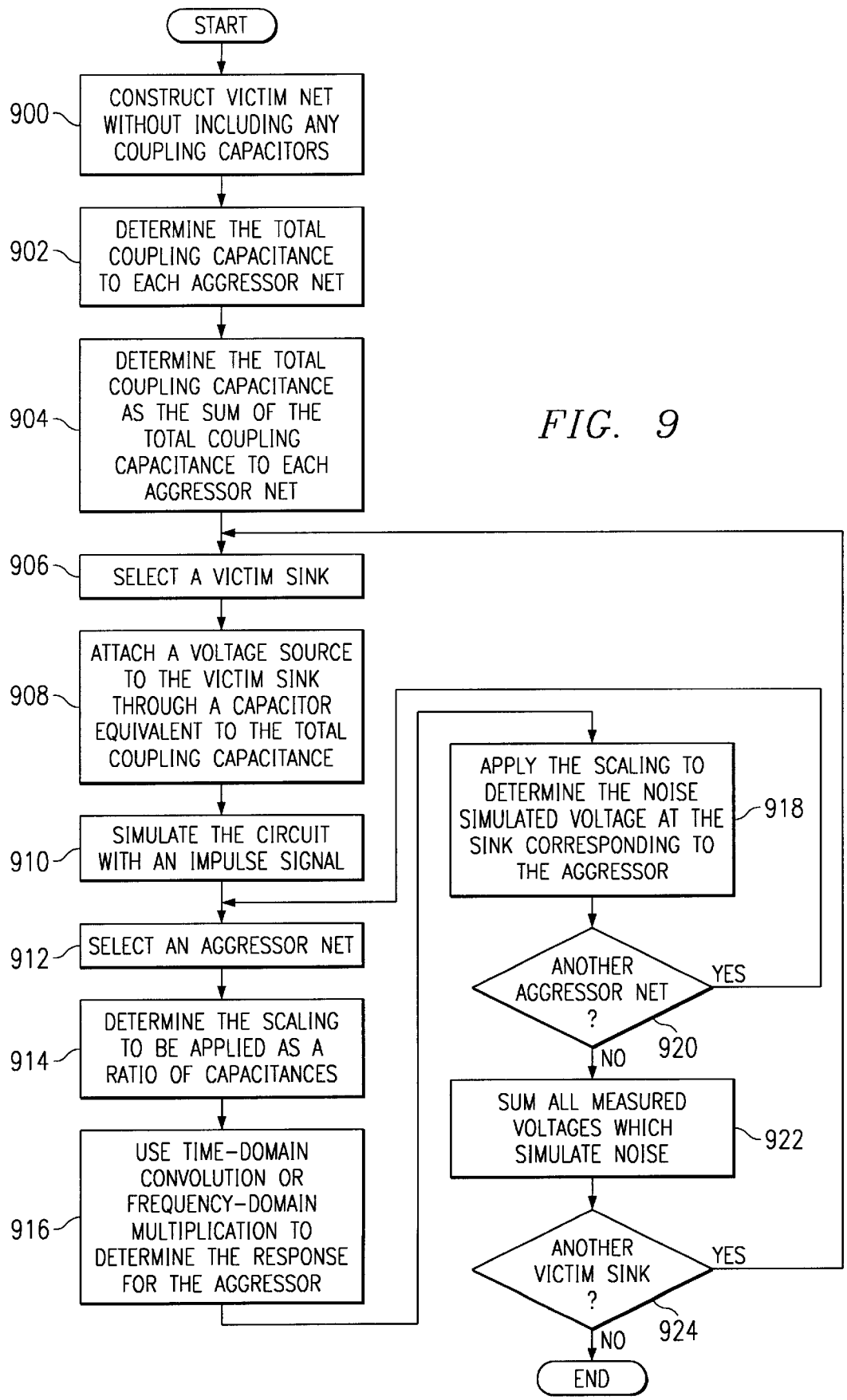
FIG. 9 is a flowchart illustrating a "faster" circuit noise simulation technique in accordance with a preferred embodiment of the present invention.

FIG. 9 is a flowchart illustrating a "faster" circuit noise simulation technique in accordance with a preferred embodiment of the present invention. In this example, the operation starts with the construction of the victim net without including any coupling capacitors (step 900). Then the total coupling capacitance to each aggressor net is determined (step 902). Then the total coupling capacitance represented by the sum of the total coupling capacitance to each aggressor net is determined (step 904). A victim sink is selected (step 906) and a voltage source is attached to the selected victim sink through a capacitance value equivalent to the total coupling capacitance determined in step 904 (step 908).

Then the circuit is simulated with an impulse signal (step 910) and then an aggressor net is selected (step 912). The scaling factor to be applied is determined as a ratio of capacitances (step 914). Then a time-domain convolution or frequency-domain multiplication is used to determined to measure the response for the aggressor net (step 916). Then the scaling factor determined in step 914 is applied to determine the noise simulated voltage induced upon the victim sink by the aggressor net selected in step 912 (step 918). Then a determination is made as to whether or not another aggressor net is to be chosen (step 920).

If another aggressor net is to be chosen (step 920:YES), the operation returns to step 912 where another aggressor net is chosen to simulate the effects of noise on the victim net. Otherwise, if another aggressor net is not to be chosen (step 920:NO), all of the measured voltages are summed up from all the noise simulation tests upon the victim sink to determine the total noise on that sink (step 922), and then it is determined as to whether or not another victim sink is to be chosen (step 924). If another victim sink is to be chosen (step 924:YES), the operation then returns to step 906 to choose another victim sink. If another victim sink is not to be chosen (step 924:NO), then the operation terminates.

Figure 10:
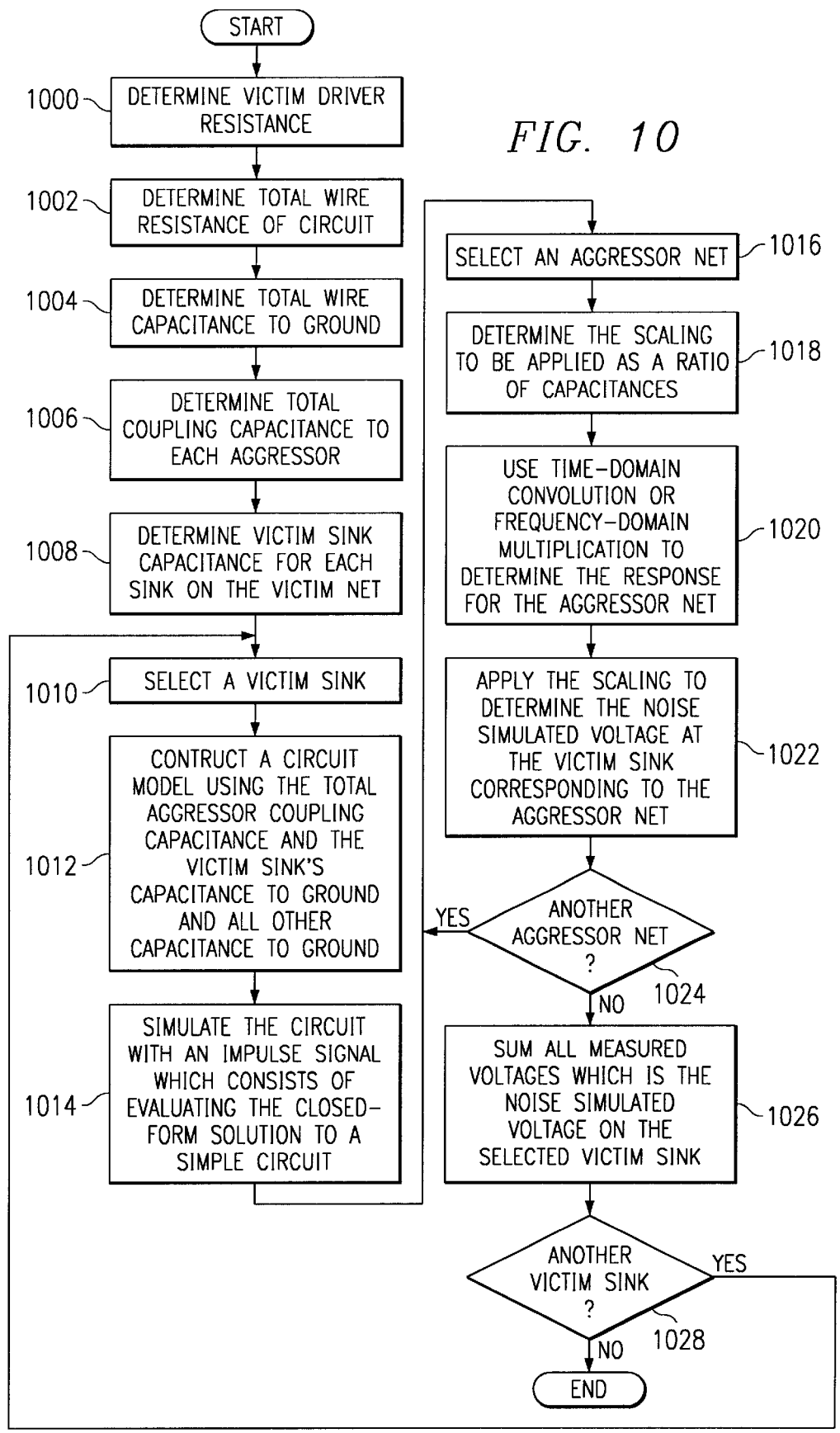
FIG. 10 is a flowchart illustrating a "fastest" circuit noise simulation technique in accordance with an preferred embodiment of the present invention.

FIG. 10 is a flowchart illustrating a "fastest" circuit noise simulation technique in accordance with an preferred embodiment of the present invention. In this example, a determination is made as to the victim driver resistance (step 1000), the total wire resistance of the circuit (step 1002), and the total wire capacitance to ground of the circuit (step 1004). The three values determined in steps 1000, 1002, and 1004 may be single circuit components, for example, resistor $R_{702}$, resistor $R_{704}$, and capacitor $C_{702}$, respectively, in FIG. 7. Then the total coupling capacitance to each aggressor is determined (step 1006). This total coupling capacitance may be a single capacitor, for example, capacitor $C_{706}$ in FIG. 7.

Then the victim sink capacitance for each sink on the victim net is determined (step 1008). This capacitance may also be represented by a single capacitor for each victim sink, for example, capacitor $C_{704}$ in FIG. 7. Then a victim sink is selected (step 1010). Then a circuit model is constructed using the total aggressor coupling capacitance being represented, for example, as $C_{706}$ in FIG. 7, the victim sink's capacitance to ground being represented, for example, as $C_{704}$ in FIG. 7, and all other capacitance to ground being represented, for example, as $C_{702}$ in FIG. 7 (step 1012). Then the circuit is simulated with an impulse signal which consists of evaluating the closed-form solution to a simple circuit (step 1014). An aggressor net is then selected (step 1016) and the scaling to be applied as a ratio of capacitances is then determined (step 1018). Then a time-domain or frequency-domain multiplication may be performed to determine the response for the aggressor net (step 1020).

The scaling factor chosen in step 1018 is applied to determine the noise simulated voltage at the victim sink corresponding to the aggressor net chosen in step 1016 (step 1022). Then a determination as to whether or not another aggressor net is to be chosen (step 1024).

If another aggressor net is to be chosen (step 1024:YES), the operation returns to step 1016. If another aggressor net is not to be chosen (step 1024:NO), then all measured voltages which simulates noise on the victim sink are summed to determine the total noise on that sink (step 1026). Then a determination is made as to whether or not another victim sink is to be tested (step 1028). If another victim sink is to be tested (step 1028:YES), the operation returns to step 1020. Otherwise, if another victim sink is not to be tested (step 1028:NO), thereafter the operation terminates.

Figure 11:
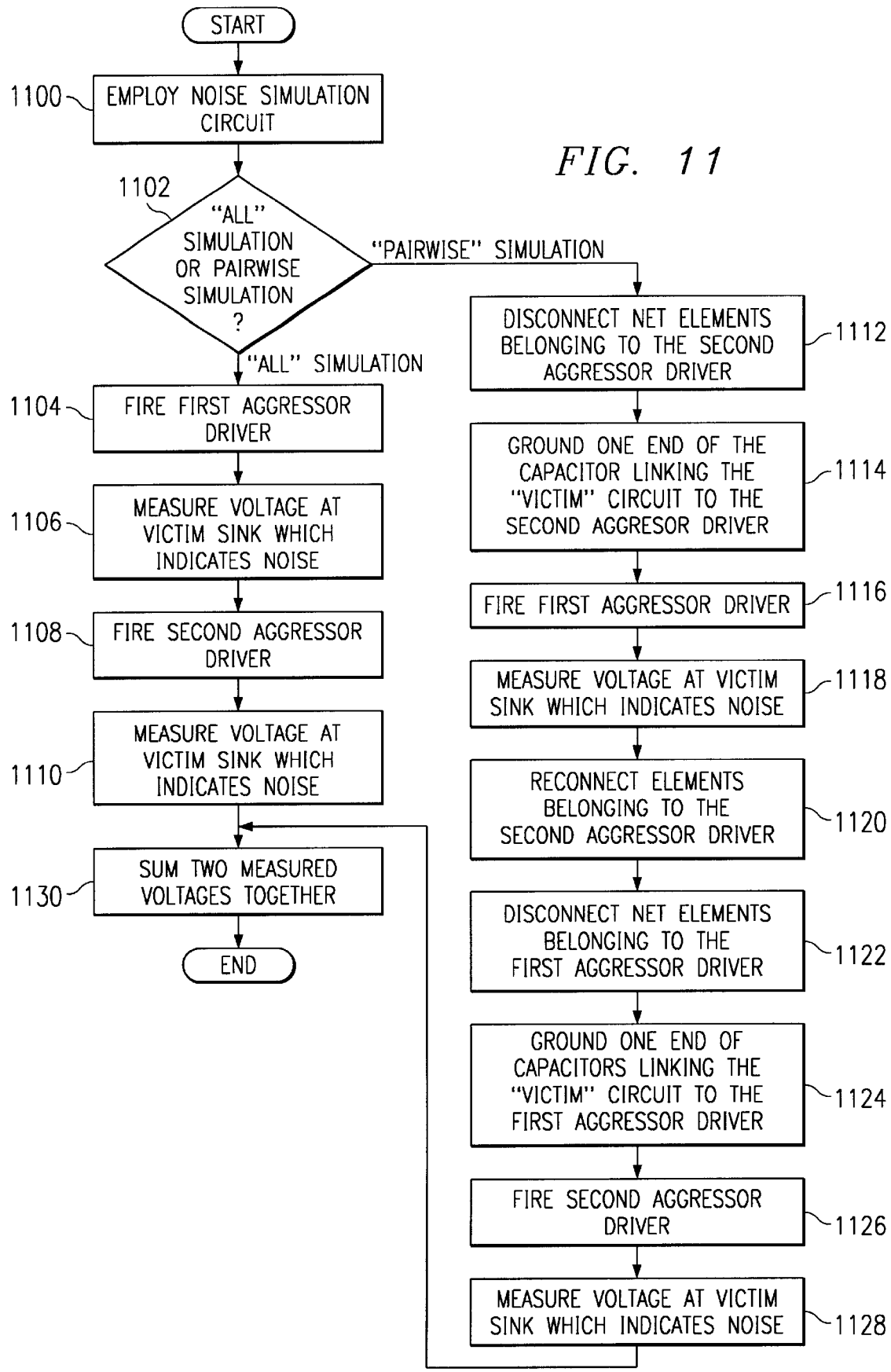
FIG. 11 is a flowchart illustrating the model circuit noise simulation process in accordance with a preferred embodiment of the present invention.

FIG. 11 is a flowchart illustrating the model circuit noise simulation process in accordance with a preferred embodiment of the present invention. FIG. 11 illustrates the special case of two aggressor nets, though the process for any number of aggressor nets is apparent from this example. In this example, the operation starts with the employment of the "fast", "faster", or "fastest" noise simulation circuit (step 1100). Then a determination is made as to which noise simulation technique is used, either the "all" simulation or the pairwise simulation (step 1102). If the "all" simulation technique is used (step 1102:"all" simulation), a first aggressor driver is fired (step 1104). Then the voltage is measured at the victim sink which indicates the noise present at the victim sink (step 1106). Then a second aggressor is fired (step 1108), the voltage measured at the victim sink again, which likewise indicates the amount of noise present at the victim sink (step 1110). The two measured voltages are summed together (step 1130) and thereafter the operation ends.

Returning to step 1102, if the pairwise simulation is used (step 1102:"pairwise" simulation), the net elements belonging to a second aggressor driver are removed from the circuit (step 1112) and one end of the capacitor linking the "victim" circuit to the second aggressor driver circuit is grounded (step 1114). Then the first aggressor driver is fired (step 1116) and the voltage appearing at the victim sink is measured which indicates the amount of noise present at the victim sink due to the first aggressor (step 1118). Then the elements belonging to the second aggressor driver are reconnected (step 1120) and the net elements belonging to the first aggressor driver are removed from the circuit (step 1122). One end of each of the capacitors linking the "victim" circuit to the first aggressor driver circuit are grounded (step 1124) and then the second aggressor driver is fired (step 1126). The voltage is measured at the victim sink which indicates the amount of noise due to the second aggressor (step 1128), the two voltages obtained from the measurements at the victim sink during the two firings are summed (step 1130) and thereafter the operation terminates.

Thus, the present invention provides an improved method and apparatus for simulation of the effects of noise on a circuit or net contained within an overall circuit design. The present invention allows for systematic and expeditious testing of circuitry contained, for example, on a digital chip. By utilizing the operation of the present invention, a chip designer, technician or other specialist may determine the effects any noise from accompanying circuitry may have on a particular circuit and, if needed, to change the design and test the new design. Therefore, by utilizing the present invention, the design of electrical circuitry may be accomplished with reduced costs and more efficient use of scarce labor resources.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such as a floppy disc, a hard disk drive, a RAM, and CD-ROMs and transmission-type media such as digital and analog communications links. For example, the present invention may be embodied in software, such as, for example, software tool "3dnoise."

In addition, the testing operation utilizing a circuit model of the present invention may be conformed to fit the needs of a particular user of the present invention. For example, in an operation containing multiple victim sinks on a net, the user may test net-sink effects individually and run each net-sink through the testing process of successively less pessimistic circuit models. Alternatively a user may test all victim sinks at each level of testing and, if any sink fails, go to the next less pessimistic circuit model and perform the test on all the victim sinks again, even though some have passed, since the improvements of the present invention allow for the simpler and less costly testing of nets.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for performing noise analysis of electrical circuits, the method comprising:
    partitioning an original multi-port circuit to a reduced circuit model having a specific layout configuration, wherein the original multi-port circuit is partitioned into at least an aggressor net and a victim net, wherein the aggressor net includes an aggressor driver;
    simulating a circuit using the reduced circuit model;
    calculating the noise induced upon the original multi-port circuit based on the simulation of the circuit,
    wherein partitioning the original multi-part circuit comprises:
        merging all coupling capacitors and resistors connected in series and parallel between the victim net circuit and the aggressor net; and
        connecting the merged coupling capacitors between the victim net and the aggressor driver.

2. The method of claim 1, wherein the aggressor net comprises at least one resistor.

3. The method of claim 2, wherein the value of the at least one resistor at the aggressor net is based upon a parameter.

4. The method of claim 1, wherein the victim net includes a victim sink circuit.

5. The method of claim 4, wherein the victim sink circuit includes at least one capacitor.

6. The method of claim 5, wherein the value of the at least one capacitor at the victim sink circuit is based upon a parameter.

7. The method of claim 1, wherein the victim net includes at least one resistor.

8. The method of claim 7, wherein the value of the resistor at the victim net circuit is based upon a parameter.

9. The method of claim 1, further comprising:
    inputting an input signal to a first port of the reduced circuit model using the specific layout configuration.

10. The method of claim 9, wherein the input signal to the first port of the reduced circuit model having a specific layout configuration is a voltage signal.

11. The method of claim 1, further comprising:
    measuring an output signal from a second port of the reduced circuit model, wherein the output signal represents noise induced upon the original multi-port circuit.

12. The method of claim 1, wherein the merged coupling capacitors care connected to the victim net at a victim sink.

13. The method of claim 1, further comprising:
    removing all circuit elements from the aggressor net except the aggressor driver.

14. The method of claim 1, wherein in the reduced circuit model, the victim net includes:
    a victim sink connected between a first node and ground;
    a wiring resistor connected between the first node and a second node; and
    a grounding capacitor and a victim driver connected in parallel between the second node and ground.

15. A method for performing noise analysis of electrical circuits, the method comprising:
    partitioning an original multi-port circuit to a reduced circuit model having a specific layout configuration, wherein the original multi-port circuit is partitioned into at least two two-port circuits;
    simulating a circuit using the reduced circuit model; and
    calculating the noise induced upon the original multi-port circuit based on the simulation of the circuit, wherein partitioning the original multi-part circuit includes:
        merging all coupling capacitors and resistors connected in series and parallel between a victim net circuit and an aggressor driver circuit; and
        connecting the merged coupling capacitors between the victim net and an aggressor driver circuit; and
    the method further includes:
        removing the aggressor driver circuit; and
        connecting the merged coupling capacitors between the victim net and the removed aggressor driver circuit to ground.

16. A method for performing noise analysis of electrical circuits, the method comprising:
    partitioning an original multi-port circuit to a reduced circuit model having a specific layout configuration, wherein the original multi-port circuit is partitioned into at least two two-port circuits;
    simulating a circuit using the reduced circuit model; and
    calculating the noise induced upon the original multi-port circuit based on the simulation of the circuit, wherein partitioning the original multi-part circuit includes:
        merging all coupling capacitors and resistors connected in series and parallel between a victim net circuit and an aggressor driver circuit; and
        connecting the merged coupling capacitors between the victim net and an aggressor driver circuit, wherein the aggressor driver circuit consists of at least one of a firing aggressor driver circuit and a non-firing aggressor driver circuit.

17. A method for performing noise analysis of electrical circuits, the method comprising:
- partitioning an original multi-port circuit to a reduced circuit model having a specific layout configuration, wherein the original multi-port circuit is partitioned into at least two two-port circuits;
- simulating a circuit using the reduced circuit model;
- calculating the noise induced upon the original multi-port circuit based on the simulation of the circuit; and
- measuring an output signal from a second port of the reduced circuit model, wherein the output signal represents noise induced upon the original multi-port circuit, wherein measuring the output signal from the second port of the reduced circuit model includes at least one of a time-domain response and a frequency-domain response.

18. A method for performing noise analysis of electrical circuits, the method comprising:
- partitioning an original multi-port circuit to a reduced circuit model having a specific layout configuration, wherein the original multi-port circuit is partitioned into at least two two-port circuits;
- simulating a circuit using the reduced circuit model; and
- calculating the noise induced upon the original multi-port circuit based on the simulation of the circuit,
- wherein the reduced circuit model comprises a two-port model having a first port and second port, and wherein the input signal is connected to the first port and the output signal measured at the second port, and further comprising at least one coupling capacitor, wherein a first end of the coupling capacitor is connected between a first end of the input port and a first end of the output port, and still further comprising at least one grounding capacitor, wherein a first end of the grounding capacitor is connected between a first end of the input port and a first end of the output port and the second end of the grounding capacitor is connected to ground, and still further comprising at least one wiring resistor, wherein the wiring resistor is connected between a first end of the input port and a first end of the output port.

19. A method for performing noise analysis of electrical circuits, the method comprising:
- partitioning an original multi-port circuit to a reduced circuit model having a specific layout configuration, wherein the original multi-port circuit is partitioned into at least two two-port circuits;
- simulating a circuit using the reduced circuit model; and
- calculating the noise induced upon the original multi-port circuit based on the simulation of the circuit,
- wherein calculating the noise induced upon the original multi-port circuit based on the measured output signal further includes a scaling factor.

20. A system for performing noise analysis of electrical circuits, the system comprising:
- partitioning means for partitioning an original multi-port circuit to a reduced circuit model having a specific layout configuration, wherein the original multi-port circuit is partitioned into at least an aggressor net and a victim net, wherein the aggressor net includes an aggressor driver;
- simulating means for simulating a circuit using the reduced circuit model;
- calculating means for calculating the noise induced upon the original multi-port circuit based on the simulation of the circuit;
- merging means for merging all coupling capacitors and resistors connected in series and parallel between the victim net and the aggressor net; and
- connecting means for connecting the merged coupling capacitors between the victim net and the aggressor driver.

21. The system of claim 20, wherein the aggressor net comprises at least one resistor.

22. The system of claim 21, wherein the value of the at least one resistor at the aggressor net is based upon a parameter.

23. The system of claim 20, wherein the victim net includes a victim sink circuit.

24. The system of claim 23, wherein the victim sink circuit includes at least one capacitor.

25. The system of claim 24, wherein the value of the at least one capacitor at the victim sink circuit is based upon a parameter.

26. The system of claim 20, wherein the victim net includes at least one resistor.

27. The system of claim 26, wherein the value of the at least one resistor at the victim net is based upon a parameter.

28. The system of claim 20, further comprising:
- removing means for removing an aggressor driver circuit; and
- connecting means for connecting the merged coupling capacitors between the victim net and the removed aggressor driver circuit to ground.

29. The system of claim 20, further comprising:
- measuring means for measuring an output signal from a second port of the reduced circuit model, wherein the output signal represents noise induced upon the original multi-port circuit.

30. The system of claim 20, wherein the merged coupling capacitors care connected to the victim net at a victim sink.

31. The system of claim 20, further comprising:
- removing means for removing all circuit elements from the aggressor net except the aggressor driver.

32. The system of claim 30, wherein in the reduced circuit model, the victim net includes:
- a victim sink connected between a first node and ground;
- a wiring resistor connected between the first node and a second node; and
- a grounding capacitor and a victim driver connected in parallel between the second node and ground.

33. A system for performing noise analysis of electrical circuits, the system comprising:
- partitioning means for partitioning an original multi-port circuit to a reduced circuit model having a specific layout configuration, wherein the original multi-port circuit is partitioned into at least two two-port circuits;
- simulating means for simulating a circuit using the reduced circuit model;
- calculating means for calculating the noise induced upon the original multi-port circuit based on the simulation of the circuit;
- wherein the partitioning means comprises:
  - merging means for merging all coupling capacitors and resistors connected in series and parallel between a victim net circuit and a aggressor driver circuit; and
  - connecting means for connecting the merged coupling capacitors between the victim net and an aggressor driver circuit; and
  - wherein the aggressor driver circuit consists of at least one of a firing aggressor driver circuit and a non-firing aggressor driver circuit.

34. The system of claim 33, further comprising:

inputting means for inputting an input signal to a first port of the reduced circuit model using the specific layout configuration.

35. The system of claim 34, wherein the input signal to the first port of the reduced circuit model having a specific layout configuration is a voltage signal.

36. A system for performing noise analysis of electrical circuits, the system comprising:

partitioning means for partitioning an original multi-port circuit to a reduced circuit model having a specific layout configuration, wherein the original multi-port circuit is partitioned into at least two two-port circuits;

simulating means for simulating a circuit using the reduced circuit model;

calculating means for calculating the noise induced upon the original multi-port circuit based on the simulation of the circuit; and measuring means for measuring an output signal from a second port of the reduced circuit model, wherein the output signal represents noise induced upon the original multi-port circuit, wherein measuring the output signal from the second port of the reduced circuit model includes at least one of a time-domain response and a frequency-domain response.

37. A system for performing noise analysis of electrical circuits, the system comprising:

partitioning means for partitioning an original multi-port circuit to a reduced circuit model having a specific layout configuration, wherein the original multi-port circuit is partitioned into at least two two-port circuits;

simulating means for simulating a circuit using the reduced circuit model; and calculating means for calculating the noise induced upon the original multi-port circuit based on the simulation of the circuit, wherein the reduced circuit model comprises a two-port model having a first port and second port, and wherein the input signal is connected to the first port and the output signal measured at the second port, and further comprising at least one coupling capacitor, wherein a first end of the coupling capacitor is connected between a first end of the input port and a first end of the output port, and still further comprising at least one grounding capacitor, wherein a first end of the grounding capacitor is connected between a first end of the input port and a first end of the output port and the second end of the grounding capacitor is connected to ground, and still further comprising at least one wiring resistor, wherein the wiring resistor is connected between a first end of the input port and a first end of the output port.

38. A system for performing noise analysis of electrical circuits, the system comprising:

partitioning means for partitioning an original multi-port circuit to a reduced circuit model having a specific layout configuration, wherein the original multi-port circuit is partitioned into at least two two-port circuits;

simulating means for simulating a circuit using the reduced circuit model; and calculating means for calculating the noise induced upon the original multi-port circuit based on the simulation of the circuit, wherein calculating the noise induced upon the original multi-port circuit based on the measured output signal further includes a scaling factor.

39. A computer program product in a computer readable medium for use in a data processing system for performing noise analysis of electrical circuits, comprising:

first instructions for partitioning an original multi-port circuit to a reduced circuit model having a specific layout configuration, wherein the original multi-port circuit is partitioned into at least an aggressor net and a victim net, wherein the aggressor net includes an aggressor driver;

second instructions for simulating a circuit using the reduced circuit model;

third instructions for calculating the noise induced upon the original multi-port circuit based on the simulation of the circuit, wherein the third instructions contain further instructions for merging all coupling capacitors and resistors connected in series and parallel between the victim net and the aggressor net and for connecting the merged coupling capacitors between the victim net and the aggressor driver.

40. The computer program product of claim 39, further comprising:

fourth instructions for inputting an input signal to a first port of the reduced circuit model using the specific layout configuration.

41. The computer program product of claim 39, further comprising:

fifth instructions for measuring an output signal from a second port of the reduced circuit model, wherein the output signal represents noise induced upon the original multi-port circuit.

42. The computer program product of claim further comprising:

sixth instructions for utilizing means for utilizing the reduced circuit model in noise analysis.

43. The computer program product of claim 39, wherein the merged coupling capacitors care connected to the victim net at a victim sink.

44. The computer program product of claim 39, further comprising:

instructions for removing all circuit elements from the aggressor net except the aggressor driver.

45. The computer program product of claim 39, wherein in the reduced circuit model, the victim net includes:

a victim sink connected between a first node and ground;

a wiring resistor connected between the first node and a second node; and a grounding capacitor and a victim driver connected in parallel between the second node and ground.

* * * * *

UNITED STATES PATENT AND TRADEMARK OFFICE
CERTIFICATE OF CORRECTION

PATENT NO.    : 6,523,149 B1
DATED         : February 18, 2003
INVENTOR(S)   : Mehrotra et al.

It is certified that error appears in the above-identified patent and that said Letters Patent is hereby corrected as shown below:

<u>Column 20,</u>
Line 40, after "claim", insert -- 39 --.

Signed and Sealed this

Sixteenth Day of September, 2003

JAMES E. ROGAN
*Director of the United States Patent and Trademark Office*